United States Patent [19]
Kato

[11] Patent Number: 5,736,460
[45] Date of Patent: Apr. 7, 1998

[54] METHOD OF FABRICATING SEMICONDUCTOR DEVICE INCLUDING GOLD INTERCONNECTIONS WHERE THE GOLD GRAIN SIZE IS A FUNCTION OF THE WIDTH OF THE INTERCONNECTIONS

[75] Inventor: Hirosi Kato, Tokyo, Japan

[73] Assignee: NEC Corporation, Tokyo, Japan

[21] Appl. No.: 873,111

[22] Filed: Jun. 11, 1997

Related U.S. Application Data

[60] Continuation of Ser. No. 441,224, May 15, 1995, abandoned, which is a division of Ser. No. 227,384, Apr. 14, 1994, abandoned.

[30] Foreign Application Priority Data

Apr. 14, 1993 [JP] Japan .................................. 5-86608

[51] Int. Cl.$^6$ .................................................. H01L 21/288
[52] U.S. Cl. ........................ 438/650; 438/678; 438/686; 438/927
[58] Field of Search .................................. 438/648, 650, 438/678, 685, 686, 927, 361, 390; 257/767, 741

[56] References Cited

U.S. PATENT DOCUMENTS

| 4,166,279 | 8/1979 | Gangulee et al. | |
|---|---|---|---|
| 4,319,264 | 3/1982 | Gangulee et al. | |
| 4,674,176 | 6/1987 | Tuckerman | 257/752 |
| 5,247,204 | 9/1993 | Yokoyama | 257/750 |
| 5,272,111 | 12/1993 | Kosaki | 437/192 |
| 5,475,265 | 12/1995 | Kato | 257/741 |
| 5,502,005 | 3/1996 | Mikagi | 438/686 |

FOREIGN PATENT DOCUMENTS

| 0276991 | 12/1986 | Japan . |
| 0292652 | 11/1988 | Japan . |
| 0039429 | 2/1991 | Japan . |

OTHER PUBLICATIONS

Fu, K., et al., "An Analytical Model for Linewidth–Dependent Electromigration Lifetime in VLSI Interconnects," Jun. 1990.

Symposium on VLSI Technology, IEEE, 4–7 Jun. 1990, pp. 29–30.

Primary Examiner—T. N. Quach
Attorney, Agent, or Firm—Sughrue, Mion, Zinn, Macpeak & Seas, PLLC

[57] ABSTRACT

In a semiconductor device having gold interconnections for connecting elements formed on a substrate with each other, the improvement is that the average dimension of gold grains constituting the gold interconnections is determined to be 0.17 through 0.25 times as large as width of the gold interconnections. In addition, the average dimension of the gold grains is determined so that the mean time to failure is not less than a predetermined period of time.

4 Claims, 4 Drawing Sheets

METHOD OF FABRICATING SEMICONDUCTOR DEVICE INCLUDING GOLD INTERCONNECTIONS WHERE THE GOLD GRAIN SIZE IS A FUNCTION OF THE WIDTH OF THE INTERCONNECTIONS

This is a continuation of application Ser. No. 08/441,224 filed May 15, 1995, abandoned, which is a divisional application of prior application Ser. No. 08/227,384 filed Apr. 14, 1994, abandoned.

FIELD OF THE INVENTION

The invention relates to a semiconductor device having gold interconnections and a method of fabricating the same, and in particular, to an improvement of such a semiconductor device with respect to an average dimension of gold grains which constitute the Gold interconnections.

PRIOR ART STATEMENT

Most semiconductor devices use interconnections constituted of aluminum or aluminum alloy having an additive of copper and/or silicon therein. Recently, with extreme downsizing of semiconductor devices, there has arisen a problem of lowering of reliability due to narrower width of interconnections constituted of aluminum or aluminum alloy or electromigration and stress-migration. For the purpose of solving this problem, many attempts have been suggested for enhancing reliability against electromigration and stress-migration by regulating dimension or size of aluminum grains or aluminum alloy grains constituting interconnections. For instance, Japanese Patent Public Disclosures Nos. 58-16546, 2-113531 and 3-22534 have suggested such attempts. However, there has arisen another problem.

It is known that gold is more expensive, but more reliable against electromigration and stress-migration than aluminum or aluminum alloy. However, it has been found that gold interconnections also cause a problem of electromigration and stress-migration if the dimension of gold interconnections are reduced. For solving this problem of electromigration in gold interconnections, Japanese Patent Public Disclosure No. 63-292652, which was filed on May 25, 1987 in Japan and laid open on Nov. 29, 1988, has suggested a method of increasing the dimension or size of gold grains constituting gold interconnections, similar to the above mentioned method of regulating the dimension of aluminum or aluminum alloy grains. In this method, metals having high melting temperature such as Ti, W and Mo are added to gold, and interconnections are fabricated from the thus produced gold. Addition of high melting temperature metals to gold allows gold grains to grow larger and crystal defect density to lower, and thus the influence due to electromigration to decrease. Thus, the reliability of the semiconductor devices can be enhanced.

However, since the aforementioned method involves high melting temperature metals in gold interconnections, specific resistance of the gold interconnections is made to be higher. In addition, the addition of high melting temperature metals makes it more difficult to process in minute fashion the material from which gold interconnections are to be fabricated by means of, for instance, dry etching or milling.

SUMMARY OF THE INVENTION

It is an object of the present invention to resolve the above mentioned problem in prior art.

Another object of the present invention is to provide semiconductor device and a method of fabricating the same for avoiding the problem of electromigration and stress-migration even if gold interconnections are processed in smaller dimension.

A further object of the present invention is to provide a semiconductor device and a method of fabricating the same for determining average dimension of gold grains constituting gold interconnections without increasing the specific resistance of the gold interconnections and deteriorating the processability of the gold interconnections.

In one aspect, the invention provides a semiconductor device having gold interconnections for connecting elements formed on a substrate with each other, the average dimension of gold grains constituting the gold interconnections being determined as a function of width of the gold interconnections.

In a preferred embodiment, the function determines the average dimension of gold grains to be a multiple of width of the gold interconnections.

In another preferred embodiment, the multiple is determined so that MTTF (mean time to failure) of the gold interconnections is not less than a predetermined period of time.

In still another preferred embodiment, the multiple is determined so that MTTF of the gold interconnections is not less than 3000 hours.

In another aspect, the invention provides a semiconductor device having gold interconnections for connecting elements formed on a substrate with each other, the average dimension of gold grains constituting the gold interconnections being determined to be 0.17 through 0.25 times as large as the width of the gold interconnections.

In a preferred embodiment, the width of the gold interconnection is 0.8 through 10 micrometers.

In still another aspect, the invention provides a method of fabricating a semiconductor device comprising the steps of forming an insulation layer on a semiconductor substrate; forming a metal layer on the insulation layer; patterning photo resist on the metal layer; forming gold interconnections between patterns of the photo resist by plating in which the metal layer serves as an electrical path, the gold interconnections having width equal to spacing between patterns of the photo resist; removing the photo resist; removing the metal layer other than that located beneath the gold interconnections; and coating an insulation layer over the substrate.

The above and other objects and advantageous features of the present invention will be made apparent from the following description made with reference to the accompanying drawings.

DESCRIPTION OF THE PREFERRED EMBODIMENTS

A preferred embodiment in accordance with the invention will be explained hereinbelow with reference to drawings.

Figure 1A:
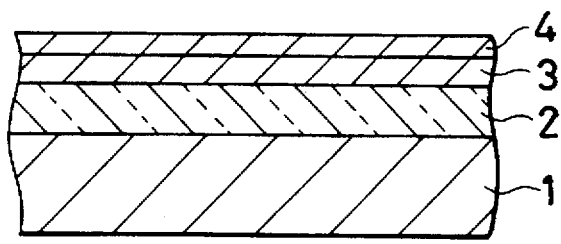
FIGS. 1A, 1B and 1C are cross sectional views showing the steps of the method of fabricating the semiconductor device in accordance with the present invention.
Figure 1B:
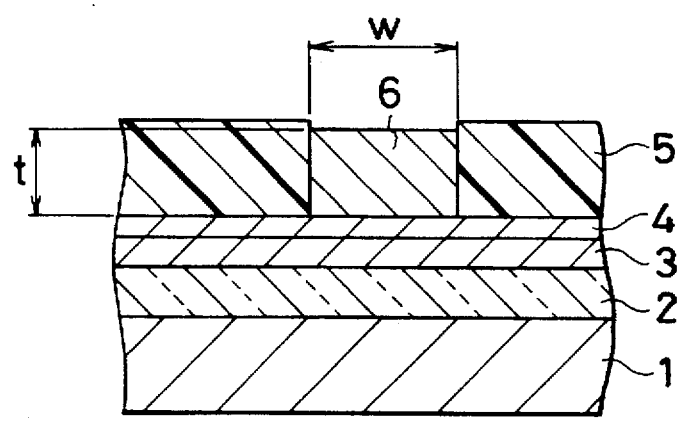
Figure 1C:
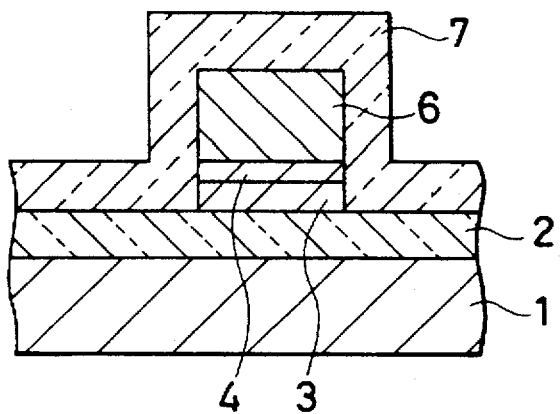

FIGS. 1A, 1B and 1C show the steps of the method of fabricating a semiconductor device in accordance with the invention.

First, as illustrated in FIG. 1A, on a semiconductor substrate 1 is formed an insulation layer 2 for insulating elements formed in the substrate 1 from electrical interconnections formed on the substrate 1. The insulation layer 2 may be constituted of films of silicon oxide and silicon nitride deposited by means of LPCVD method. Then, a titanium (Ti) layer 3 having 0.12 micrometers thickness and a platinum (Pt) layer 4 having 0.15 micrometers are subsequently formed on the substrate 1 by means of sputtering method. The titanium layer 3 and platinum layer 4 serve as an electrical path through which an electrical current passes when a gold layer for gold interconnections or wires is formed by plating, and also serve as a base layer for gold interconnections or wires. In place of subsequent formation of Ti and Pt layers by means of sputtering method, Ti, W and Au layers may be subsequently formed by means of sputtering method.

Then, as illustrated in FIG. 1B, photo resist 5 is formed on the Pt layer 4 in a predetermined pattern by means of photolithography process. Then, an electrolytic plating is carried out. During the plating, the patterned photo resist 5 serves as a mask and the Ti and Pt layers 3, 4 serve as an electrical path through which an electrical current for plating runs. A gold film 6 is separated out between patterns of the patterned photo resist 5. The gold film 6 has thickness t and width w equal to spacing w between the patterns of the patterned photo resist 5. The width w is preferably in the range of 0.8 through 10 μm.

Then, as illustrated in FIG. 1C, the photo resist 5 is removed, and further the Pt and Ti layers 4, 3 are removed by etching process other than the layers lying beneath the gold film 6. Finally, a silicon oxide layer 7 is coated all over the insulation layer 2 and the gold film 6 by means of CVD method in which the growth temperature is equal to or less than 400 degrees centigrade. Thus, a semiconductor device having the gold interconnection is obtained.

Figure 2A:
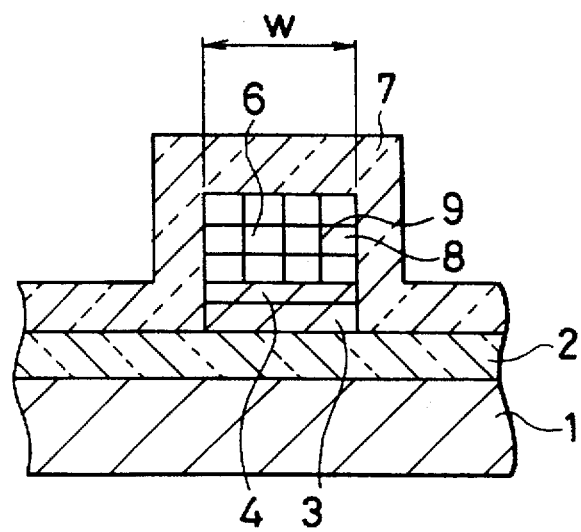
FIG. 2A is a cross sectional view of the semiconductor device.
Figure 2B:
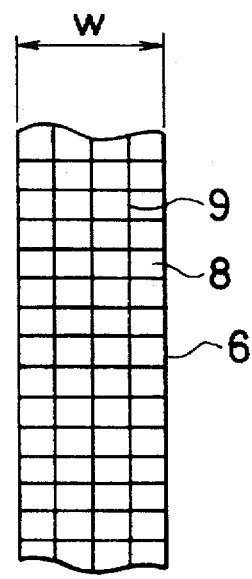
FIG. 2B is a tog view of the arrangement of gold grains in the gold interconnection illustrated in FIG. 2A.

As illustrated in FIGS. 2A and 2B, the gold film 6 formed in the step illustrated in FIG. 1B is constituted of a mass of gold grains 8 which are delimited with grain boundaries 9.

Figure 3:
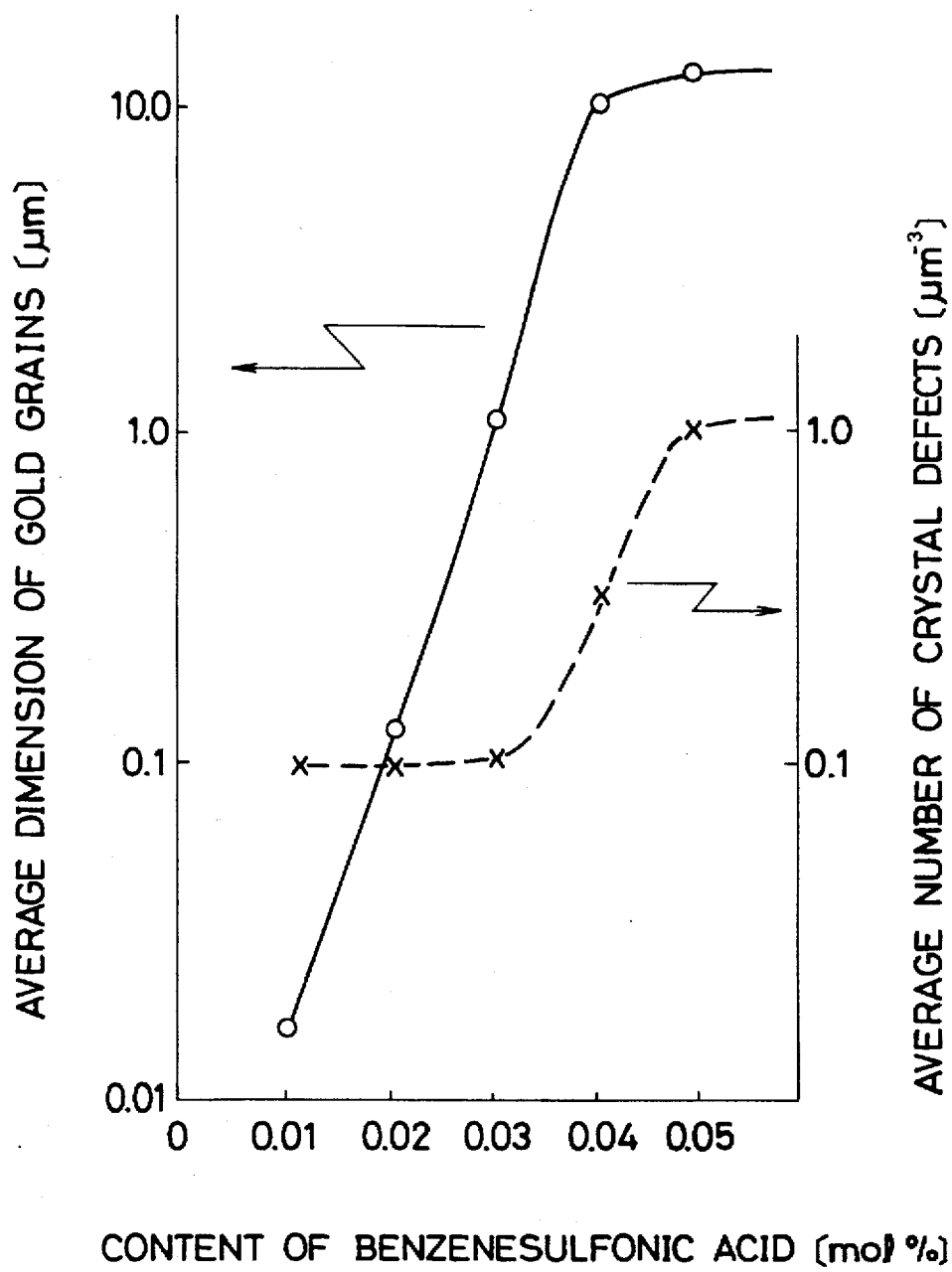
FIG. 3 is a graph showing the relationship between the content of benzenesulfonic acid included in gold plating fluid and both of the average dimension of separated gold grains and the average number of crystal defect.

FIG. 3 shows the relationship between the content of benzenesulfonic acid in plating fluid and the average dimension of the separated gold grains. The average number of crystal defects is also shown in FIG. 3.

In FIG. 3, the average dimension of gold grains is 0.1 μm when the content of benzenesulfonic acid is 0.02%. As the content of benzenesulfonic acid increases, the average dimension of gold grains increases. The average dimension of gold grains reaches 10 μm when the content of benzenesulfonic acid is in excess of 0.04%. Similarly, as the content of benzenesulfonic acid increases, namely, as the average dimension of gold grains increases, the average number of crystal defects increases. In particular, the average number of crystal defects shows a high value when the average dimension of gold grains are equal to or more than 1 μm. Although not illustrated, the dispersion of the dimension of gold grains becomes wider, as the average dimension of gold grains increases.

Figure 4:
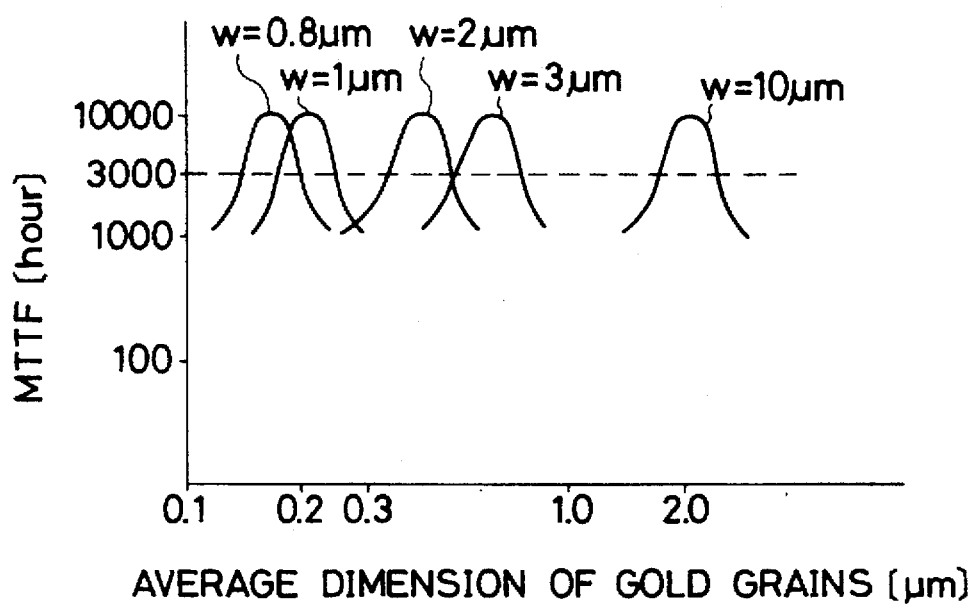
FIG. 4 is a graph showing the relationship between the average dimension of gold grains and MTTF in the test for evaluating the reliability of gold interconnections.

FIG. 4 shows a data of the experiment for evaluating the reliability of the gold interconnections relative to the average dimension of gold grains included in the gold interconnections. The experiment was carried out under the condition that the electrical current density J is equal to $1*10^6$ A/cm$^2$, the temperature is 150 degrees centigrade, the interconnections have 50 μm length, and the interconnection width is varied in 0.8 μm, 1 μm, 2 μm, 3 μm and 10 μm. Interconnections used in a semiconductor device are generally required to have MTTF (Mean Time To Failure) more than $10^6$ hours under the condition that electrical current density J is $1*10^4$ A/cm$^2$ and temperature is 25 degrees centigrade. Since the condition of the experiment corresponds to approximately 300 times as accelerated as the generally required condition, it is necessary to obtain MTTF equal to or more than 3000 hours.

In the experiment, MTTF was measured for samples having interconnection width w of 0.8 μm, 1 μm, 2 μm, 3 μm and 10 μm. The dimension of gold grains were varied in each samples in the measurement of MTTF. The result of the test is shown in FIG. 4. It has been found from the result that an optimum dimension of gold grains for obtaining MTTF more than 3000 hours ranges in a certain range for each interconnection width. As explained earlier with reference to FIG. 3, the average number of crystal defects and the dispersion thereof decrease as the dimension of grains decreases. However, according to an actual evaluation of the reliability, MTTF lowers when the dimension of gold grains is less than a certain value for each interconnection width, and MTTF also lowers when the dimension of gold grains is more than another certain value for each interconnection width. In this experiment, the thickness t of the gold interconnections 6 was varied in the range of 0.3 through 1.5 μm for each interconnection width with the result that the thickness t of the gold interconnections does not influence MTTF as long as the electrical current density J is kept fixed.

In addition, as is clear from FIG. 4, a range of optimum dimension of gold grains has a close relationship with the interconnection width w. As the interconnection width w increases, the range of dimension of gold grains ensuring more than 3000 hours MTTF shifts toward a greater range. Thus, it has been found that the range of dimension of gold grains ensuring more than 3000 hours MTTF for each interconnection width divided by its own interconnection width gives the range of 0.17 through 0.25.

Figure 5:
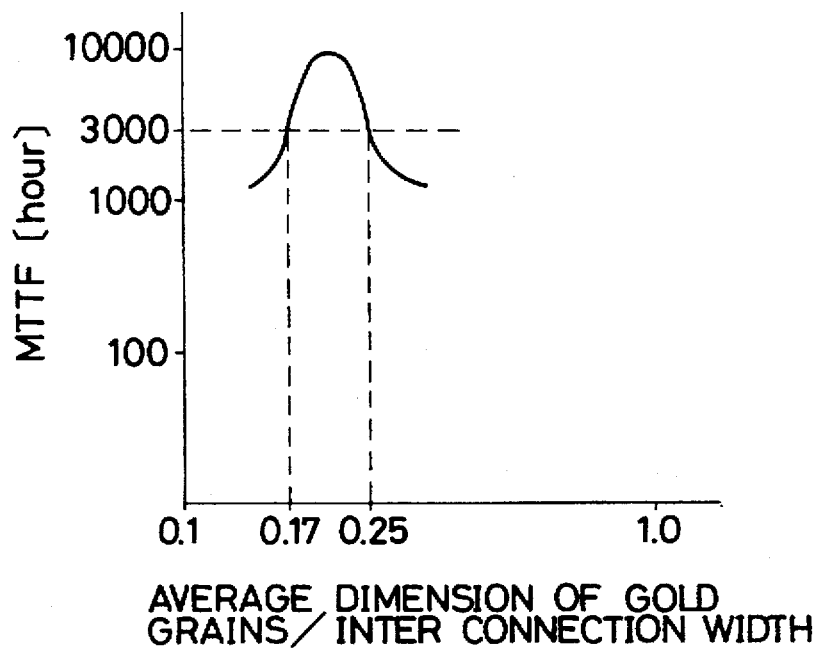
FIG. 5 is a graph showing the relationship between the average dimension of gold grains relative to the width of gold interconnections and MTTF in the test for evaluating the reliability of gold interconnections.

FIG. 5 shows the above explained analysis in detail. As illustrated in FIG. 5, the ratio of the average dimension of gold grains to interconnection width w is required to be in the range of 0.17 through 0.25 to ensure that MTTF is over a desired value, for instance, 3000 hours in the embodiment.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of fabricating a semiconductor device comprising the steps of:

forming an insulation layer on a semiconductor substrate;

forming a metal layer on said insulation layer;

forming a photoresist on said metal layer to outline patterns on said metal layer;

setting a value for mean time to failure time;

forming gold interconnections between said patterns of said photoresist by plating in which said metal layer serves as an electrical path, each of said gold interconnections having a width equal to spacing between patterns of said photoresist, said gold interconnections being formed to have gold grains having an average dimension which is determined to obtain said value of said mean time to failure;

removing said photoresist;

removing said metal layer from said insulation layer in areas except the area located beneath said gold interconnections; and coating an insulation layer over said insulation layer formed on said substrate and over said gold interconnections.

2. The method in accordance with claim 1, wherein said step of forming gold interconnections comprises the step of:

forming gold grains having an average dimension which is determined to obtain said value of said mean time to failure, wherein said value is 3000 hours.

3. The method in accordance with claim 1, wherein said step of forming said gold interconnections comprises the step of:

forming gold grains having an average dimension which is 0.17 through 0.25 times as large as said width of said gold interconnections.

4. The method in accordance with claim 3, wherein said width lies in a range from 0.8 through 10 micrometers.

* * * * *